United States Patent
Klomp et al.

(10) Patent No.: US 11,543,479 B2
(45) Date of Patent: Jan. 3, 2023

(54) MRI APPARATUS

(71) Applicants: Tesla Dynamic Coils BV, Zaltbommel (NL); Futura Composites B.V., Heerhugowaard (NL); UMC Utrecht Holding B.V., Utrecht (NL)

(72) Inventors: Dennis Klomp, Utrecht (NL); Edwin Versteeg, Utrecht (NL); Jeroen Siero, Utrecht (NL); Martino Borgo, Zaltbommel (NL)

(73) Assignees: Tesla Dynamic Coils BV, Zaltbommel (NL); Futura Composites B.V., Heerhugowaard (NL); UMC Utrecht Holding B.V., Utrecht (NL)

( * ) Notice: Subject to any disclaimer, the term of this patent is extended or adjusted under 35 U.S.C. 154(b) by 0 days.

(21) Appl. No.: 17/185,327

(22) Filed: Feb. 25, 2021

(65) Prior Publication Data
US 2021/0270920 A1 Sep. 2, 2021

(30) Foreign Application Priority Data
Feb. 28, 2020 (GB) .................................. 2002916

(51) Int. Cl.
*G01R 33/561* (2006.01)
*G01R 33/36* (2006.01)
*G01R 33/385* (2006.01)

(52) U.S. Cl.
CPC ....... *G01R 33/561* (2013.01); *G01R 33/3607* (2013.01); *G01R 33/3858* (2013.01)

(58) Field of Classification Search
CPC ............ G01R 33/3607; G01R 33/3858; G01R 33/561
See application file for complete search history.

(56) References Cited

U.S. PATENT DOCUMENTS

| 5,185,576 | A | 2/1993 | Vavrek et al. |
| 5,764,059 | A | 6/1998 | Mansfield et al. |
| 5,909,120 | A * | 6/1999 | Mori .................. G01R 33/3852 324/318 |
| 7,932,722 | B2 | 4/2011 | Amm et al. |
| 2008/0231268 | A1 | 9/2008 | Patzak et al. |
| 2010/0102815 | A1 | 4/2010 | Parker et al. |
| 2013/0345547 | A1* | 12/2013 | Vahala ..................... A61N 7/02 600/411 |

(Continued)

FOREIGN PATENT DOCUMENTS

| CN | 108872898 A | 11/2018 |
| EP | 3 351 955 A1 | 7/2018 |
| EP | 3 364 205 A1 | 8/2018 |

OTHER PUBLICATIONS

Search Report under Section 17 for Great Britain Patent Application No. GB2002916.1 dated Jul. 24, 2020.

(Continued)

*Primary Examiner* — Gregory H Curran
(74) *Attorney, Agent, or Firm* — McCormick, Paulding & Huber PLLC

(57) ABSTRACT

An MRI system coil insert 2 for use within a bore B of a main MRI system 1, the coil insert 2 comprising at least one gradient coil, for creating a spatially varying magnetic field along a respective axis and being arranged to be electrically driven at an ultrasonic frequency.

28 Claims, 5 Drawing Sheets

(56) References Cited

U.S. PATENT DOCUMENTS

2016/0187436 A1* 6/2016 Piron .............. G01R 33/34053
324/309

OTHER PUBLICATIONS

Edwin Versteeg, et al., "Supersonic imaging with a silent gradient axis driven at 20 kHz", ISMRM 27th Annual Meeting & Exhibition, May 11-16, 2019, University Medical Centre Utrecht, Utrecht, Netherlands, Spinoza Center for Neuroimaging, Amsterdam, Netherlands.

Dennis Klomp, et al., "RF transparent ultrafast gradient insert", ISMRM 27th Annual Meeting & Exhibition, May 11-16, 2019, Radiology, UMC Utrecht, Utrecht, Netherlands, MRCoils, Zaltbommel, Netherlands, Donders institute for Brain Cognition and Behaviour, Radboud University, Nijmegen, Netherlands, Gorter center, Leiden UMC, Leiden, Netherlands, Futura Composites, Heerhugowaard, Netherlands, Spinoza Center for Neuroimaging, Amsterdam, Netherlands.

Zhu et al., "MR Spectroscopy and Spectroscopic Imaging of the Brain", NIH Public Access, Mol. Biol. Author manuscript; available in PMC, vol. 711: pp. 203-226, Aug. 10, 2012.

Versteeg et al., "Supersonic imaging with a silent gradient axis driven at 20 kHz", International Society for Magnetic Resonance in Medicine, Berkeley, CA, US, No. 4856, Apr. 26, 2019.

Dumez et al., "Spatial encoding and spatial selection methods in high-resolution NMR spectroscopy", Progress in Nuclear Magnetic Resonance Spectroscopy, vol. 109, Aug. 3, 2018, pp. 101-134, Oxford, GB.

Salustri et al., "Simple but Reliable Solutions for Spiral MRI Gradient Design", Journal of Magnetic Resonance, Orlando, FL, US, vol. 140, No. 2, (1999), pp. 347-350, http://www.idealibrary.com.

European Search Report for Application No. 21 15 9467 dated Nov. 30, 2021.

* cited by examiner

MRI APPARATUS

CROSS-REFERENCE TO RELATED APPLICATION

This application claims foreign priority benefits under 35 U.S.C. § 119 to British Patent Application No. 2002916.1 filed on Feb. 28, 2020, the content of which is hereby incorporated by reference in its entirety.

TECHNICAL FIELD

This invention relates to MRI apparatus, in particular to MRI system coil inserts for use with MRI systems, MRI system arrangements comprising an MRI system together with a coil insert or an MRI system together with other components, as well as an echo planar spectroscopic imaging system comprising an MRI system arrangement and methods for operating MRI systems.

BACKGROUND

MRI (Magnetic Resonance Imaging) systems are widely used for imaging subjects and also acquiring spectral information in the case of MRSI (Magnetic Resonance Spectroscopy Imaging). An MRI system typically comprises a magnet arrangement for creating a large static magnetic field $B_0$, a set of radio frequency coils or antennas for generating an alternating magnetic field $B_1$ and collecting a magnetic resonance signal (that is to say acquiring magnetic resonance data), and a set of gradient coils to allow spatial encoding on the $B_0$ field to enable tomographic imaging. Further in the case of MRSI the gradient coils are also used to allow spectroscopic encoding.

Spatial encoding of the magnetic resonance signals is typically achieved by fast switching of three magnetic field gradients (X, Y, Z) created by gradient coils located around the scanner bore in which the subject to be investigated will be located.

Typically, in existing systems, the gradient coils are driven at in the range of 0-10 kHz. As the gradient coils are driven in the auditory range (20 Hz-20 kHz) considerable efforts have been made towards reducing the noise caused by the Lorenz forces induced in, and by, the switching gradients. Such methods include using material to dampen the noise which is created.

To boost MRI spatiotemporal resolution the gradient system can be driven "faster" and "stronger". That is to say with higher gradient slew rates (T per m per s) and higher gradient strengths (mT per m). At present gradient performance can be chiefly limited by uncomfortable peripheral nerve stimulations (PNS) induced by too fast switching of a strong magnetic field gradient. Switching of the gradients induces electric fields and currents in conducting tissue, such as muscles and nerves, and may result in nerve depolarisation and ultimately nerve stimulation.

SUMMARY

Thus, it is desirable to develop MRI apparatus and methods of operating MRI apparatus which can give enhanced performance whilst not increasing physical discomfort for a patient due to audible effects and/or peripheral nerve stimulations. Similarly, it would be desirable to produce MRI apparatus and methods of using MRI apparatus which can reduce audible effects and/or peripheral nerve stimulation and/or other causes of discomfort whether or not there is an increase in performance of the MRI process itself. It is also of interest if scans can be completed more quickly—to minimise discomfort for the patient and/or to obtain results that are less affected by the time taken to acquire the scan.

According to a first aspect of the present invention there is provided an MRI system coil insert for use within a bore of a main MRI system, the coil insert comprising at least one gradient coil for creating a spatially varying magnetic field along a respective axis and being arranged to be electrically driven at an ultrasonic frequency.

This can allow investigation to be undertaken using functionality of the main MRI system in combination with the insert. Using ultrasonic frequencies has various advantages. First it can lead to lower forces being experienced by the coils themselves as there is less time for Lorenz forces to take hold. This means the coils can be lighter weight than if they are to be driven at more conventional frequencies—so the coils can be physically different and the structure to support them can be different. Second the switching of the gradient becomes inaudible to the patient. Third it has been found that peripheral nerve stimulation (PNS) in a patient under investigation can be lower where ultrasonic frequencies are used—it is thought that this is because there is insufficient time for the nerves to react to the switching field.

The coil insert may have a central region free from gradient coil windings. This can allow the provision of a window in the insert through which a patient can see when the head of the patient is located within the insert. This can be facilitated by the use of lighter weight coils/lower forces on the coils.

The insert may be generally cylindrical. The insert may have a main axis. The main axis may be arranged to be aligned with a main axis of the bore of the main MRI system with which the insert is used. In such a case, the axes of the insert and the main MRI system may be aligned by virtue of being parallel with one another or coincident with one another.

The at least one gradient coil may comprise a Z gradient coil for creating a spatially varying magnetic field along the main axis of the insert. The at least one gradient coil may comprise an X gradient coil or a Y gradient coil for creating a spatially varying magnetic field transverse to the main axis of the insert.

The coil insert may comprise a first gradient coil for creating a spatially varying magnetic field along a first respective axis and a second gradient coil for creating a spatially varying magnetic field along a second respective axis.

The first gradient coil may be a Z gradient coil for creating a spatially varying magnetic field along the main axis of the insert and the second gradient coil may be an X gradient coil or a Y gradient coil for creating a spatially varying magnetic field transverse to the main axis of the insert.

Where the coil insert comprises a first gradient coil and a second gradient coil the coil insert may still have a central region free from gradient coil windings.

The coil insert may comprise a third gradient coil for creating a spatially varying magnetic field along a third respective axis which is transverse to the first axis and the second axis. Typically, however the provision of one or two gradient coils and no third gradient coil is preferred as this facilitates the provision of a central region free from gradient coil windings.

The main MRI system will have its own gradient coils and in operation these may be used in co-operation with the gradient coils of the insert. Thus for example where the insert lacks a gradient coil for creating a spatially varying magnetic field along a particular axis, spatial encoding on that axis may be accomplished using the gradient coil of the main MRI system.

The Z gradient coil may comprise at least one set of windings.

The Z gradient coil may comprise a first set of windings provided at a first end of the insert and a second set of windings provided at a second end of the insert. In one set of embodiments a region between the first and second sets of windings may be free of Z gradient coil windings.

It has been determined that whilst creating a central region free from windings may lead to a less linear magnetic field, this can be tolerated in an insert of the present kind. Particularly where the insert is to be used for investigations involving a patient's head. Here the insert need not have an extensive axial length.

In some instances, the Z gradient coil may comprise more than two set of windings. For example, four or more sets of windings may be provided.

The windings may be arranged to allow the provision of a segmented gradient on the Z-axis. That is to say rather than the provision of a continuous, say linear gradient along the Z-axis, there is provided a series of gradient portions along the axis. This means that a smaller maximum absolute magnetic field may be used in setting up the gradient along the Z-axis as a whole. This in turn can help minimise peripheral nerve stimulation (PNS) in a patient under investigation. This arrangement is more useful with longer inserts—that is where the Z-axis is longer. Such an insert may be for investigating a larger region of a patient—it may be a whole body insert.

To put this another way the windings may be arranged to allow the provision of a spatially non-monotonical gradient along the Z-axis.

The windings may be arranged to allow the provision of a spatially multi-lobed gradient along the Z-axis.

The windings may be arranged to allow the provision of a spatially oscillating gradient along the Z-axis.

The windings may be arranged to allow the provision of a gradient that has a polynomial or sinusoidal variation spatially along the Z-axis.

Here it will be understood that in referring to these gradient patterns we are referring to variation in amplitude/size of the magnetic field that is seen along the Z-axis.

The windings of the Z gradient coil may be provided in two layers where turns in a first of the two layers are provided out of register with turns in a second of the two layers. This can help improve the spatial encoding which is achievable.

The first set of windings of the Z gradient coil may be provided in two layers where turns in a first of the two layers are provided out of register with turns in a second of the two layers. The second set of windings of the Z gradient coil may be provided in two layers where turns in a first of the two layers are provided out of register with turns in a second of the two layers.

The X gradient coil or Y gradient coil may comprise at least one set of windings.

The X gradient coil or Y gradient coil may comprise a pair of windings which are provided on radially opposite sides of the insert. Each winding in the pair may comprise a plurality of helically wound turns where each complete turn has an inner arcuate segment, a first end segment extending outwardly to an outer arcuate segment, and a second end segment extending inwardly from the outer arcuate segment to a corresponding inner arcuate segment of a subsequent turn. Each inner arcuate segment may follow a side wall of the insert. Each outer arcuate segment may follow a side wall of the insert.

Where a Z gradient coil is provided and comprises first and second sets of windings as defined above, an X or Y gradient coil may be provided and disposed in the insert axially between the first and second sets of windings of the Z gradient coil.

The X or Y gradient coil may comprise a third set of windings and a fourth set of windings which are provided on radially opposite sides of the insert and axially between the first and second sets of windings of the Z gradient coil. Thus the third and fourth sets of windings may be provided in the region which is free of Z gradient coil windings. Note here that the third and fourth set of windings are the same windings introduced as a pair of windings above—they are third and fourth in the sense that in this set of embodiments, the first and second windings are defined in relation to the Z gradient coil.

A circumferential spacing may be provided between the third and fourth set of windings such that there is a region in the insert free from windings of the Z gradient coil and windings of the X or Y gradient coil. This region may be arranged as a window through which a patient may see when their head is disposed in the insert.

Each of the third set of windings and the fourth set of windings may comprise a plurality of helically wound turns where each complete turn has an inner arcuate segment, a first end segment extending outwardly to an outer arcuate segment, and a second end segment extending inwardly from the outer arcuate segment to a corresponding inner arcuate segment of a subsequent turn.

Each inner arcuate segment may follow a side wall of the insert. Each outer arcuate segment may follow a side wall of the insert.

Such an arrangement can help maximise the axial length of the insert over which the X or Y gradient coil is able to generate a linear magnetic field. It can also allow maximising of the circumferential spacing between the ends of the third and fourth sets of windings, to allow creation of the window for the patient.

The insert may be provided with partial or even without shielding coils for the at least one gradient coil. Where the insert comprises a first gradient coil and a second gradient coil the insert may be provided with partial or even without shielding coils for the first gradient coil and the second gradient coil.

The insert may comprise at least one capacitor electrically connected to the at least one gradient coil so as to make the respective gradient coil resonant at a predetermined ultrasonic frequency. This helps efficiency in driving the gradient coil at the predetermined frequency. It can also mean that lower current can be used from a high impedance signal source to drive the gradient coil and this can reduce inductive coupling to other coils/metal objects in its region.

Where the insert comprises a first gradient coil and a second gradient coil, at least one first capacitor may be electrically connected to the first gradient coil so as to make the first gradient coil resonant at a first predetermined ultrasonic frequency, and at least one second capacitor may be electrically connected to the second gradient coil so as to make the second gradient coil resonant at a second predetermined ultrasonic frequency.

The first predetermined ultrasonic frequency may be the same as the second predetermined ultrasonic frequency.

Preferably however the first predetermined ultrasonic frequency is different from the second predetermined ultrasonic frequency.

This facilitates operating the two gradient coils at different frequencies which in turn can lead to more spatial frequencies being sampled during imaging, as this combination will generate a Lissajous encoding rather than circular or spiral encodings. In turn this can increase the potential for the acceleration of imaging.

A potential problem has been determined with the use of two frequencies:—an audible sound can result. This has been determined to be due to "beats" being generated between the sound created at the two frequencies.

Preferably the difference in frequency between the first predetermined ultrasonic frequency and the second predetermined ultrasonic frequency is an inaudible frequency. That is either an infrasonic frequency or an ultrasonic frequency. Typically, in practice the first predetermined ultrasonic frequency and the second predetermined ultrasonic frequency will be selected so that the difference in frequency therebetween is at an infrasonic frequency.

According to another aspect of the present invention there is provided an MRI system coil insert arrangement comprising a coil insert as defined above and a signal generator arrangement for electrically driving the at least one gradient coil at ultrasonic frequencies.

Where the at least one gradient coil comprises a Z gradient coil, the windings of the coil and the signal generator arrangement may be arranged to provide a segmented gradient on the Z-axis.

The windings and the signal generator arrangement may be arranged to provide a spatially non-monotonical gradient along the Z-axis.

The windings and the signal generator arrangement may be arranged to provide a spatially multi-lobed gradient along the Z-axis.

The windings and the signal generator arrangement may be arranged to provide a spatially oscillating gradient along the Z-axis.

The windings and the signal generator arrangement may be arranged to provide a gradient that has a polynomial or sinusoidal variation spatially along the Z-axis.

Where the insert comprises a first gradient coil and a second gradient coil, the signal generator arrangement may be arranged to drive the first gradient coil at a first selected ultrasonic frequency and to drive the second gradient coil at a second selected ultrasonic frequency. The first and second frequencies may be the same as each other. The first and second frequencies may be different from each other.

Preferably the difference in frequency between the first selected ultrasonic frequency and the second selected ultrasonic frequency is an inaudible frequency. That is either an infrasonic frequency or an ultrasonic frequency. Typically, in practice the first selected ultrasonic frequency and the second selected ultrasonic frequency will be selected so that the difference in frequency therebetween is at an infrasonic frequency.

The first selected frequency may be the same as the first predetermined frequency. The second selected frequency may be the same as the second predetermined frequency.

Thus, is will be noted that the first and second coils may be driven at the selected frequencies whether or not capacitors are provided to make the coils resonant at those frequencies—although it is preferred where capacitors are provided and the coils are driven at their respective resonant frequencies.

According to another aspect of the present invention there is provided an MRI system arrangement comprising an MRI system having a main bore, and an MRI system coil insert as defined above for use within said bore.

According to another aspect of the present invention there is provided an MRI system arrangement comprising an MRI system having a main bore and an MRI system coil insert arrangement as defined above with the coil insert arranged for use within said bore.

Whilst the above features have been introduced in the context of an MRI system coil insert, features and ideas defined above can be used in an MRI system itself where context allows.

Thus according to another aspect of the present invention there is provided an MRI system comprising a coil arrangement, the coil arrangement comprising at least one gradient coil for creating a spatially varying magnetic field along a respective axis and being arranged to be electrically driven at an ultrasonic frequency.

In general the optional features above are also optional features for this aspect of the invention where context allows. Not all are repeated here in the interest of brevity, but some are explicitly recited by way of example.

The MRI system may comprise a signal generator arrangement for electrically driving the at least one gradient coil at ultrasonic frequencies.

In one set of embodiments the at least one gradient coil comprises a Z gradient coil and the windings of the coil and the signal generator arrangement are arranged to provide a segmented gradient on the Z-axis.

To put this another way the windings and the signal generator arrangement may be arranged to provide a spatially non-monotonical gradient along the Z-axis.

The windings and the signal generator arrangement may be arranged to provide a spatially multi-lobed gradient along the Z-axis.

The windings and the signal generator arrangement may be arranged to provide a spatially oscillating gradient along the Z-axis.

The windings and the signal generator arrangement may be arranged to provide a gradient that has a polynomial or sinusoidal variation spatially along the Z-axis.

The MRI system may comprise at least one capacitor electrically connected to the at least one gradient coil so as to make the respective gradient coil resonant at a predetermined ultrasonic frequency.

The coil arrangement may comprise a first gradient coil and a second gradient coil, with at least one first capacitor electrically connected to the first gradient coil so as to make the first gradient coil resonant at a first predetermined ultrasonic frequency, and at least one second capacitor electrically connected to the second gradient coil so as to make the second gradient coil resonant at a second predetermined ultrasonic frequency.

The first predetermined ultrasonic frequency may be the same as the second predetermined ultrasonic frequency.

Preferably however the first predetermined ultrasonic frequency is different from the second predetermined ultrasonic frequency.

Preferably the difference in frequency between the first predetermined ultrasonic frequency and the second predetermined ultrasonic frequency is an inaudible frequency. That is either an infrasonic frequency or an ultrasonic frequency. Typically, in practice the first predetermined ultrasonic frequency and the second predetermined ultrasonic frequency will be selected so that the difference in frequency therebetween is at an infrasonic frequency.

Where the coil arrangement comprises a first gradient coil and a second gradient coil, the signal generator arrangement may be arranged to drive the first gradient coil at a first selected ultrasonic frequency and to drive the second gradient coil at a second selected ultrasonic frequency. The first and second frequencies may be the same as each other. The first and second frequencies may be different from each other.

Preferably the difference in frequency between the first selected ultrasonic frequency and the second selected ultrasonic frequency is an inaudible frequency. That is either an infrasonic frequency or an ultrasonic frequency. Typically, in practice the first selected ultrasonic frequency and the second selected ultrasonic frequency will be selected so that the difference in frequency therebetween is at an infrasonic frequency.

The first selected frequency may be the same as the first predetermined frequency. The second selected frequency may be the same as the second predetermined frequency.

According to another aspect of the present invention there is provided a method of operating an MRI system arrangement as defined above.

According to a further aspect of the present invention there is provided an echo planar spectroscopic imaging system comprising an MRI system arrangement having an acquisition section for acquiring magnetic resonance data and a reconstruction section for reconstructing images and spectroscopic information from acquired magnetic resonance data,
the acquisition section comprising:

an RF transmission arrangement arranged to output single- or multi-band RF pulses;

a first gradient coil arranged to be driven at an ultrasonic frequency for creating a spatially varying magnetic field along a first respective axis and a second gradient coil arranged to be driven at an ultrasonic frequency for creating a spatially varying magnetic field along a second respective axis; and a signal generator arrangement for electrically driving the first gradient coil at a first selected ultrasonic frequency and driving the second gradient coil at second selected ultrasonic frequency, wherein the signal generator arrangement is configured, as part of acquiring the magnetic resonance data, to apply, during a readout period, a plurality of chirp pulses to the first gradient coil and to apply a plurality of chirp pulses to the second gradient coil so as to achieve spectral encoding and spatial encoding on the first and second respective axes; and the acquisition section is arranged to readout magnetic resonance data during said readout period and the reconstruction section is arranged to reconstruct an image and spectral information relating to the image from the magnetic resonance data readout during said readout period.

This can allow spatial encoding in the duration of each chirp, and spectral encoding over the duration of the readout period. By using ultrasonic frequencies and the series of chirps it is possible to obtain MRSI data—that is an MRI image and associated spectral data—that relates to an investigation period that is significantly shorter than that achieved with pre-existing techniques. This can avoid information becoming lost or confused by changes overtime—e.g. flow of metabolites or chemical changes in metabolites in the subject during the investigation period.

Each chirp pulse may have a length of less than 100 milliseconds, preferably less than 10 milliseconds. In one embodiment each chirp pulse has a length of in the order of 1 millisecond. In another embodiment each chirp pulse has a length of in the order of 0.5 millisecond.

The signal generator arrangement may be configured to apply at least 10 chirp pulses during said readout period, preferably at least 50 pulses. In one embodiment 200 chirp pulses may be applied in the readout period.

Thus, it can be seen that the readout period may be of the order of say 100 milliseconds—say 200 chirp pulses of 0.5 millisecond each, or 200 milliseconds—say 200 chirp pulses of 1 millisecond each. This in turn can lead to a bandwidth of 2 kHz and 1 kHz, and resolution in the spectral data of in the order of 10 Hz and 5 Hz respectively.

The acquisition section may be arranged acquire magnetic resonance data during a plurality of readout periods in order to produce a set of magnetic resonance data.

The acquisition section may be arranged to cause the RF transmission arrangement to output a single- or multi-band RF pulse before the start of each readout period and the acquisition may be arranged to apply, during each readout period, a respective plurality of chirp pulses to the first gradient coil and to apply a respective plurality of chirp pulses to the second gradient coil so as to achieve spectral encoding and spatial encoding on the first and second respective axes.

The reconstruction section may be arranged to reconstruct an image and spectral information relating to the image from the set of magnetic resonance data readout during said plurality of readout periods.

The first selected ultrasonic frequency and the second selected ultrasonic frequency may be the same frequency.

Preferably the first selected ultrasonic frequency is different from the second selected ultrasonic frequency.

Preferably the difference in frequency between the first selected ultrasonic frequency and the second selected ultrasonic frequency is an inaudible frequency. That is either an infrasonic frequency or an ultrasonic frequency. Typically, in practice the first selected ultrasonic frequency and the second selected ultrasonic frequency will be selected so that the difference in frequency therebetween is at an infrasonic frequency.

The acquisition section may comprise at least one first capacitor electrically connected to the first gradient coil so as to make the first gradient coil resonant at a first predetermined ultrasonic frequency, and at least one second capacitor electrically connected to the second gradient coil so as to make the second gradient coil resonant at a second predetermined ultrasonic frequency.

The first predetermined ultrasonic frequency may be the same as the second predetermined ultrasonic frequency.

Preferably however the first predetermined ultrasonic frequency is different from the second predetermined ultrasonic frequency.

Preferably the difference in frequency between the first predetermined ultrasonic frequency and the second predetermined ultrasonic frequency is an inaudible frequency. That is either an infrasonic frequency or an ultrasonic frequency. Typically, in practice the first predetermined ultrasonic frequency and the second predetermined ultrasonic frequency will be selected so that the difference in frequency therebetween is at an infrasonic frequency.

The first selected frequency may be the same as the first predetermined frequency. The second selected frequency may be the same as the second predetermined frequency.

The acquisition section may further comprise a third gradient coil arranged to be electrically driven for creating a spatially varying magnetic field along a third respective axis. The signal generator arrangement may be arranged for electrically driving the third gradient coil, and in particular to provide spatial encoding on the third respective axis to allow selection of a slice in the subject under investigation from which the above mentioned magnetic resonance data, or set of magnetic resonance data is acquired during the respective readout period or respective plurality of readout periods.

The acquisition section may be arranged to acquire further magnetic resonance data, or further sets of magnetic resonance data in subsequent runs to facilitate improvement in the signal to noise ratio in the acquired data.

The acquisition section may be arranged to acquire further magnetic resonance data, or further sets of magnetic resonance data in subsequent runs with different slices in the subject under investigation selected using the spatial encoding on the third respective axis.

The MRI system arrangement may comprise an MRI system having a main bore and an MRI system coil insert arrangement for use within said bore.

The insert may comprise the first gradient coil and the second gradient coil.

The insert may comprise a coil insert according to a first aspect of the present invention.

The third gradient coil may be a gradient coil of the MRI system itself. This can allow this gradient coil to be further from the patient—helping keep any window in the insert unobstructed.

Typically, the MRI system will comprise further respective gradient coils which are also arranged for creating a spatially varying magnetic field along the first respective axis and for creating a spatially varying magnetic field along the second respective axis. However, in carrying out the acquisition of magnetic resonance data in accordance with the above further aspect of the invention, then in at least some cases these further respective gradient coils may be left unused.

In other implementations there may be no insert and rather the first and second gradient coils of the above further aspect of the invention may be provided in a main body of the MRI system.

In other implementations use may be made of gradient coils in both the main MRI system and in an insert even on the same axis. Thus, for example Z gradient coils in the insert and in the main MRI system might both be used in encoding.

According to another aspect of the present invention there is provided a method of echo planar spectroscopic imaging using an MRI system arrangement having an acquisition section for acquiring magnetic resonance data and a reconstruction section for reconstructing images and spectroscopic information from acquired magnetic resonance data, the method comprising:

applying a single- or multi-band RF pulse to a subject under investigation; electrically driving a first gradient coil arranged at a first ultrasonic frequency for creating a spatially varying magnetic field along a first respective axis and electrically driving a second gradient coil at a second ultrasonic frequency for creating a spatially varying magnetic field along a second respective axis;

as part of acquiring magnetic resonance data, applying, during a readout period a plurality of chirp pulses to the first gradient coil and a plurality of chirp pulses to the second gradient coil so as to achieve spectral encoding and spatial encoding on the first and second respective axes;

reading out magnetic resonance data during said readout period; and reconstructing an image and spectral information relating to the image from the magnetic resonance data readout during said readout period.

Note that, in general terms and with any necessary modifications in wording, all of the further features defined above following any aspect of the invention above are applicable as further features of all other aspects of the invention defined above. These further features are not restated after each aspect of the invention merely for the sake of brevity.

BRIEF DESCRIPTION OF THE DRAWINGS

Embodiments of the present invention will now be described, by way of example only, with reference to the accompanying drawings in which.

DETAILED DESCRIPTION

Figure 1:
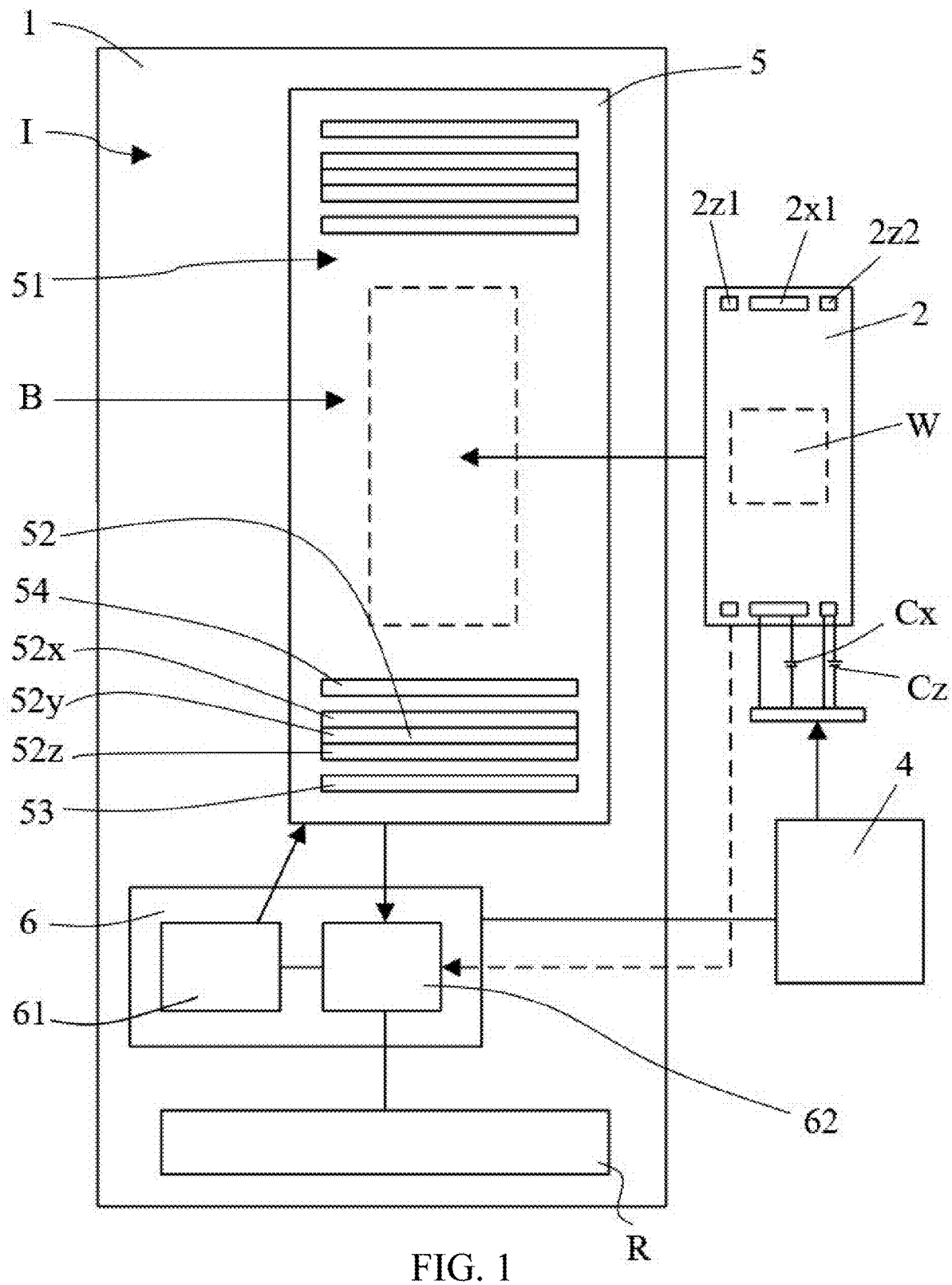
FIG. 1 schematically shows an MRI system arrangement.

FIG. 1 schematically shows an MRI system arrangement comprising, in this instance, a main MRI system 1 and an MRI system coil insert 2. In this embodiment the structure and operation of the main MRI system 1 is to a large degree conventional. Thus, whilst various aspects of the main MRI system are shown in the drawings and will be discussed below, other aspects of the MRI system 1 are not shown or described in detail, but of course these details are well known and understood in the field of MRI investigations.

The MRI system insert 2 is arranged to be supplied and used in cooperation with existing MRI systems. This is of course commercially advantageous since it means that existing MRI systems may be adapted to make use of the present ideas rather than a whole new MRI system needing to be developed. That said, in alternatives, an MRI system arrangement shown in FIG. 1 may be built from the ground up and in further alternatives the features and functions of the insert 2 may be incorporated into the main body of the MRI system 1 if so desired.

Figure 2:
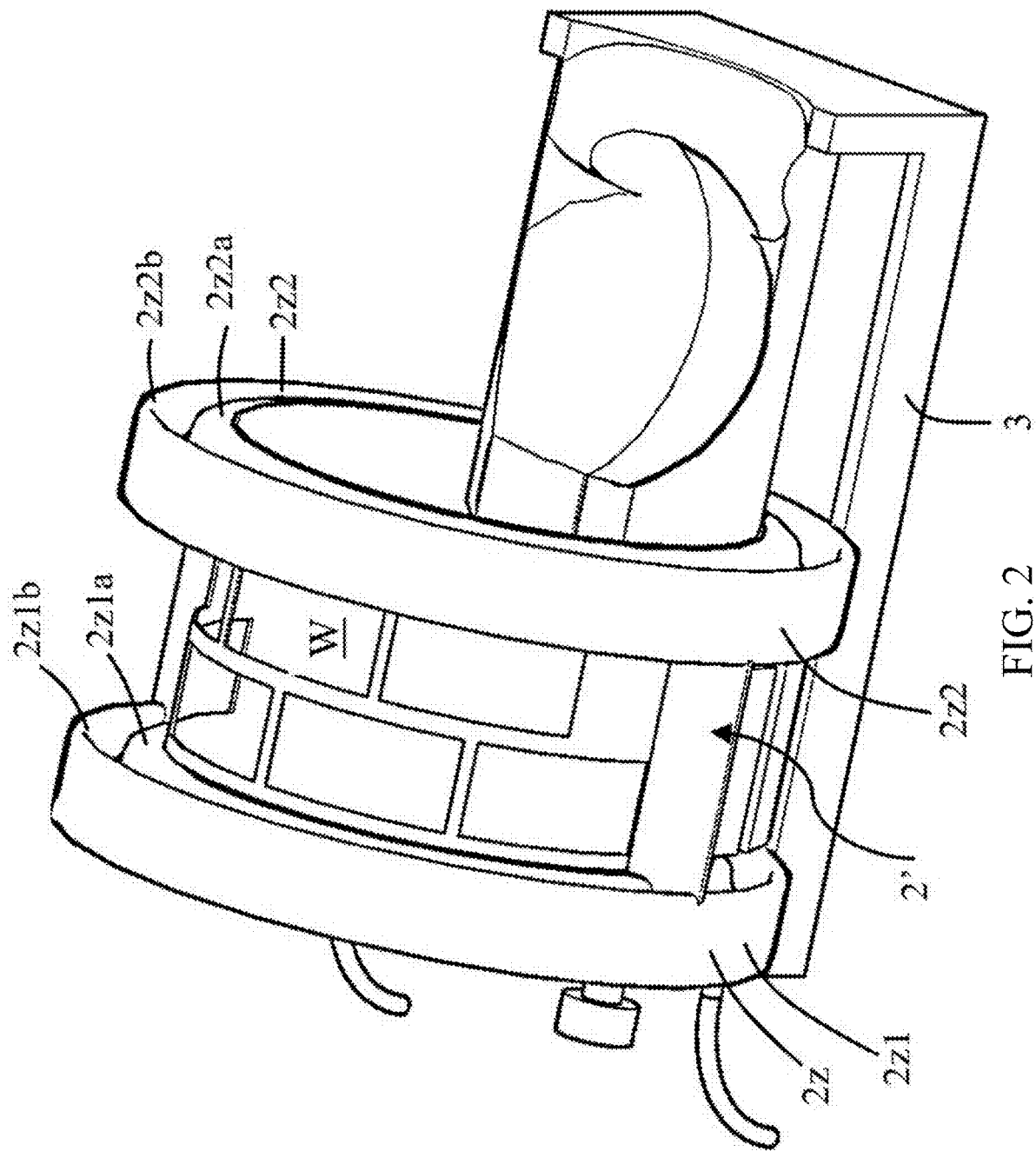
FIG. 2 schematically shows an MRI system coil insert of a type which may be used in the MRI system arrangement shown in FIG. 1 and having a Z gradient coil.

In FIG. 1 the MRI system coil insert 2 is shown outside of the main MRI system 1 for clarity. However, in operation the insert 2 will be moved to a position inside the main bore B, of the main MRI system 1, to the position shown in dotted lines in FIG. 1. FIG. 2 schematically shows an insert 2 of the type shown in FIG. 1 mounted on a bed 3 of an MRI system 1 so as to be slidingly movable between a position shown in FIG. 2 which corresponds to the position shown in FIG. 1 with the insert 2 outside of the bore B of the MRI system 1 and a position inside the bore B of the MRI system 1.

Various different forms of insert may be provided.

The insert 2' shown in FIG. 2 comprises an insert Z gradient coil 2z comprising a first set of windings 2z1 and a second set of windings 2z2, one provided at each end of the insert 2.

The lack of Z coil windings in a central region between the first set of windings 2z1 and second set of windings 2z2 can lead to a sub-optimal field but it has been determined that in at least some circumstances these imperfections can be tolerated. As an example, with the relatively small space in between the first set of windings 2z1 and 2z2 in an insert designed for use of examination of a person's head, these imperfections can be tolerated.

The insert 2 shown in FIG. 1 comprises a similar insert Z gradient coil 2z comprising first and second sets of windings 2z1 and 2z2 and further comprises an insert X gradient coil 2x comprising first and second sets of windings 2x1 and 2x2. These sets of windings are more clearly shown in isolation in FIG. 3.

Figure 3:
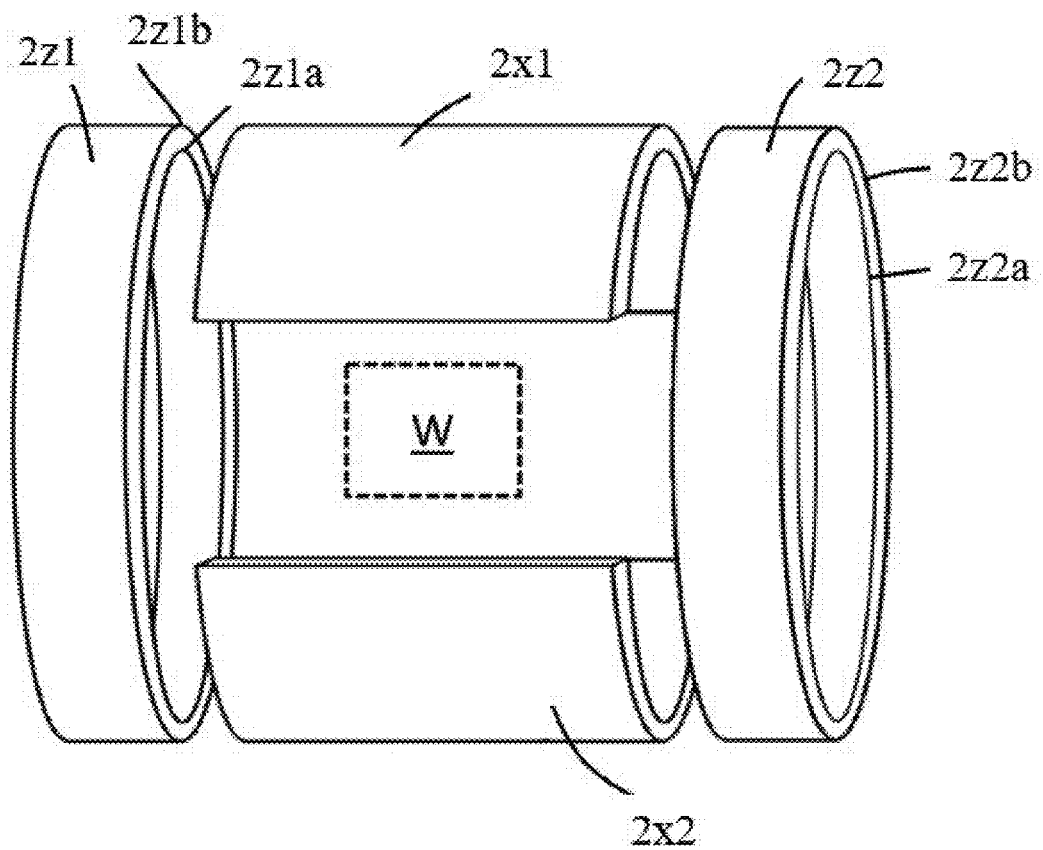
FIG. 3 schematically shows part of an alternative MRI system coil insert showing just a Z gradient coil and a X or Y gradient coil of the insert.

In both the insert 2 of FIGS. 1 and 3, and that 2' of FIG. 2, each set of Z windings 2z1, 2z2 itself comprises two helically wound sets of turns 2z1a, 2z1b, 2z2a, 2z2b. The second layer 2z1b, 2z2b is wound over the top of the respective first layer 2z1a, 2z2a but slightly out of register therewith, so that the conductors in the outer set can provide a reversed current direction. It has been found that this improves the shielding of the gradient fields to minimize eddy currents in surrounding conductive materials.

Figure 4:
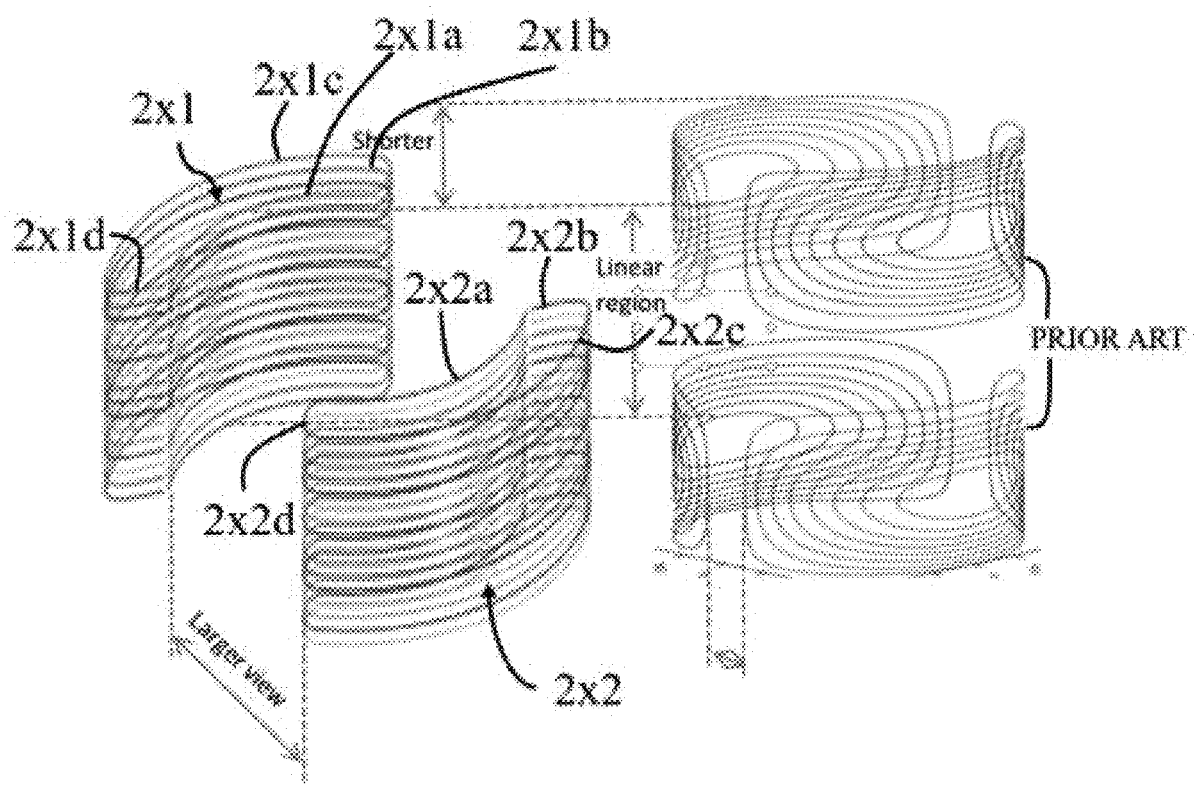
FIG. 4 shows in more detail the winding pattern of the X or Y gradient coil shown in FIG. 3 in comparison with part of a traditional X or Y gradient coil.

The winding pattern of the windings 2x1, 2x2 of the X gradient coil 2x of the insert 2 of FIGS. 1 and 3 can be more clearly seen by considering FIG. 4 in combination with FIG. 3.

FIG. 4 shows the sets of windings 2x1, 2x2 of the X insert gradient coil 2x in comparison with the inner layer of a more conventionally wound X gradient coil (labelled "prior art" in FIG. 4). Each set of windings 2x1, 2x2 is helically wound and each complete turn comprises an inner arcuate segment 2x1a, 2x2a which is connected to an outer arcuate segment 2x1c, 2x2c via a first end segment 2x1b, 2x2b. The turn is completed by a second end segment 2x1d, 2x2d which leads back inwards towards the start of the next turn. The next turn starts with a corresponding inner arcuate segment 2x1a, 2x2a of a subsequent turn, and so on.

It will be seen that the arc of each inner arcuate segment has the same radius as that of the other inner arcuate segments. Similarly the arc of each outer arcuate segment has the same radius as that of the other outer arcuate segments. The radius of the arc of the inner segments is smaller than that of the outer segments.

This winding arrangement leads to a longer linear region in the axial direction of the insert than in prior art winding arrangements and allows a larger circumferential spacing between the ends of the two sets of windings 2x1, 2x2 than in the patterns of the prior art. There can be compromises in the nature of the field which is produced by such windings but it has been found that the benefits outweigh these issues in the present systems.

The insert 2 shown in FIGS. 1 and 3 is designed for use in making investigations of a patient's head—of course in particular the brain. Thus, the insert 2 is arranged for a patient's head to be disposed in the bore of the insert. The arrangement of the Z gradient coil and X gradient coil 2z, 2x in the insert allows the provision of a window W (schematically shown in FIG. 3 and the location of which is schematically indicated in FIG. 1) to be provided in the insert 2 through which a user may see when their head is inserted in the insert 2. This window W may be an opening in the insert if desired or an opening which is filled with a transparent material.

Further in an insert 2' of the type shown in FIG. 2 where there is no X gradient coil there will again be a possibility of creating one or more window W through which a user can see when their head is within the insert 1. Of course, the provision of such a window helps against feelings of claustrophobia for the patient.

The MRI system arrangement comprises a signal generator arrangement 4, which is provided for driving the gradient coils 2z, 2x of the insert 2.

In commercial terms, this signal generator arrangement 4 may be provided along with the insert 2 and together these can be considered as an MRI system coil insert arrangement which can be used in an existing MRI system 1. Of course, again in other alternatives, where a complete system is developed, a separate signal generator arrangement may be unnecessary and instead this may be incorporated into systems provided within the main MRI system.

The signal generator arrangement 4 is arranged for driving the gradient coils 2z, 2x in the insert 2 at ultrasonic frequencies. That is to say frequencies above the audible range.

Where there are two or more gradient coils in the insert 2, for example in the insert 2 of the type shown in FIGS. 1 and 3, in some instances the same ultrasonic frequency may be used for driving each of the gradient coils 2z, 2x.

Alternatively, and preferably, where there are two gradient coils, say the two gradient coils 2z, 2x in the insert 2, the signal generator arrangement 4 is arranged for driving these at respective different ultrasonic frequencies.

As an example, in some embodiments a single ultrasonic frequency might be used and set at 20.2 kHz. In other embodiments where two different frequencies are used, these might for example be 22 kHz on the one hand and 19.9 kHz on the other hand—one being used to drive the X gradient coil 2x and one being used to drive the Z gradient coil 2z. In practice, as will be appreciated, there is quite a lot of freedom in which frequencies might be selected.

However, it has been determined that it is particularly advantageous if first, two different frequencies are selected and second, if the difference between these two different frequencies is itself an inaudible frequency. This is because, as mentioned in the introduction, preferable spatial encoding can be achieved where the two frequencies are different and having the difference in frequency in the inaudible range avoids the generation of audible "beats" signals being created between sound which is generated at the two selected inaudible frequencies. Typically, the two frequencies may be selected so that the difference in the frequency is below the human hearing range. That is to say, the difference in frequency is 20 Hz or less.

As schematically illustrated in FIG. 1, the signal generator arrangement 4 is arranged for driving each gradient coil 2x, 2z in the insert via a respective capacitor Cx, Cz. The values of these capacitors are chosen in order to make the respective gradient coil 2x, 2z resonant at the frequency at which it is to be driven by the signal generator arrangement 4. This facilitates the use of a high impedance signal generator and the delivery of lower currents to the gradient coils 2x, 2c which in turn can help reduce coupling therebetween.

Note that the idea of making a gradient coil resonant at a predetermined frequency encompasses a situation where the gradient coil is one electrical entity driven by one signal generator and where the gradient coil is made up of a plurality of separate electrical entities that may be individually driven. Thus where there are say plural independent windings in a gradient coil each will be made resonant by provision of an appropriate capacitor.

In the present arrangement no RF shielding is provided in the insert 2 or between the insert 2 and the main MRI system. This helps minimise losses due to the setting up of eddy currents which might otherwise occur when the insert gradient coils 2x, 2z are driven at ultrasonic frequencies. At the same time, the insert, and in particular gradient coils 2x, 2z, are relatively transparent to the signals to be transmitted and received by the main MRI system. Thus, operation of the main MRI system may continue with the insert 2 in position within the bore B of the main MRI system.

In general terms minimising the amount of electrically conductive materials in the vicinity of the insert gradient coils 2x, 2z (or any gradient coils to operate at ultrasonic frequencies) helps improve efficiency by minimising the effect of eddy currents. As spacing between a gradient coil being driven at ultrasonic frequencies and metal objects increases, the problem is reduced. Thus, in the present arrangement, the fact that active gradient field shielding is sub-optimal or even absent toward the main MRI system and there are other metal objects in the main MRI system can be tolerated. This desire to minimise metal in the vicinity of the ultrasonically driven gradient coils, i) makes it less than obvious that using such frequencies is practical, and ii) makes their inclusion in an insert rather than a main MRI machine more convenient in at least some circumstances.

Figure 5:
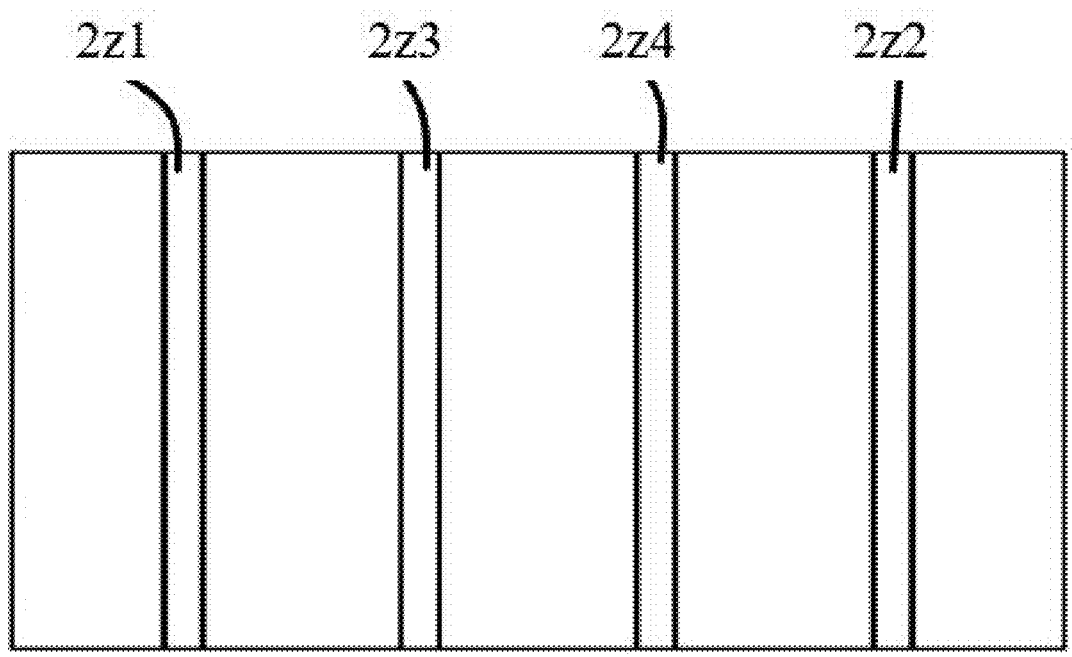
FIG. 5 shows an alternative set of windings of a Z gradient coil in an alternative MRI system coil insert for creating a segmented Z axis gradient.

FIG. 5 schematically shows an alternative form of Z gradient coil which may be provided in an alternative form of insert. Similarly, again, in an alternative this form of Z gradient coil might be provided in the main body of a newly constructed MRI machine 1.

Here the Z gradient coil comprises four sets of windings 2z1-2z4 each having the same construction of the sets of Z windings 2z1, 2z2 described above. Again, these windings are arranged to be driven by the signal generator arrangement 4 and arranged to be made resonant at the selected driving frequency by the inclusion of one or more capacitor (not shown).

In this case rather than a monotonically changing Z gradient field being set up in the insert by the Z gradient coil as is the case traditionally and in the inserts described above in relation to FIGS. 1 to 4, here a segmented Z gradient is created. That is to say rather than a monotonically changing Z gradient field the insert of FIG. 5 is arranged to create a more complexly varying Z gradient field. In particular, this may be set up so as to be multi-lobed and for example, to have a polynomial or sinusoidal spatial variation along the Z-axis. This in turn means that the maximum amplitude of difference in the gradient field from one end of the axis to the other can be controlled whilst still providing an adequate change in gradient per unit length along the insert. It has been determined that the provision of a segmented Z gradient field can be advantageous in particular where a longer insert is to be used i.e. one for investigating a larger region than just the head, say where the insert is used for whole body investigations or the gradient windings are incorporated into a whole body MRI machine. Further, it has been determined that SENSE (Sensitivity Encoding) reconstruction techniques, as well known in the MRI art, can successfully unfold the information gained when acquiring magnetic resonance data using a segmented Z gradient of the type produced by the insert shown in FIG. 5. Furthermore, it has been determined that the use of such a segmented Z gradient can reduce the onset of PNS in an investigated subject or alternatively allow the use of a stronger Z gradient before the onset of PNS is obtained.

Operation of the MRI system arrangement will now be described, following a brief introduction of the main MRI system 1.

In general terms the main MRI system 1 comprises an acquisition section I for acquiring magnetic resonance data and a reconstruction section R for reconstructing images and spectroscopic information relating to those images from the acquired magnetic resonance data. In the arrangement shown in FIG. 1, the insert 2 and signal generator arrangement 4 form part of the acquisition section I. That is to say they cooperate with elements of the acquisition section I of the main MRI machine in acquiring magnetic resonance data which may then be reconstructed by the reconstruction section R.

The elements of the acquisition section I in the main MRI machine 1 in general terms comprises a magnet and coil arrangement 5 and a control system 6. The control system 6 has an output section 61 for controlling operation of the magnet and coil arrangement 5 and a receiver section 62 for receiving information back from the magnet and coil arrangement 5. In the present arrangement where the coil insert 2 is being used, the output section 61 also issues control signals to the signal generator arrangement 4 and in some embodiments the receiver section 62 might also receive output from the insert 2 although this is optional. In the arrangement now described receiving of the magnetic resonance data, is carried out in the main MRI machine 1 itself.

As alluded to above in alternatives the components of the insert 2 and signal generator arrangement may be incorporated into an MRI machine itself.

It will be appreciated that the MRI machine will typically comprise one or more "computer" for controlling operation and processing received data. Each such computer may comprise a processor, memory, and at least one data storage device. The control system 6 may be a computer implemented. The reconstruction section R may be computer implemented.

The magnet and coil arrangement 5 comprises a main magnet 51 for creating a static field, X, Y and Z gradient coils 52, radio frequency transmitter coils 53 and radio frequency receiver coils 54.

In operation the output section 61 delivers driving currents to the gradient coils 52 and causes appropriate radio frequency transmit pulses to be output by the transmit coil 53, whilst the receiver section 62 receives input from the receiver coils 54.

In the present embodiment the output section 61 also provides a control triggering signal to the signal generator arrangement 4 to allow it to time appropriately the generation of gradient driving signals for driving the insert gradient coils 2x, 2z.

In principle, any combination of the gradient coils 52 of the main MRI system 1 and gradient coils 2x, 2z of the insert 2 may be used to give a desired encoding effect.

Most typically, perhaps, where the insert 2 includes an X gradient coil 2x and a Z gradient coil 2z, these might be used in combination with the Y gradient coil 52y of the main MRI machine 1.

Thus, in a particular example, the gradient coil 52y of the main MRI machine 1 may be used for spatial encoding in order to select a particular slice in a subject for investigation and the Z and X gradient coils 2z, 2y in the insert 2 can be used for spatial encoding within that slice.

In a situation where the insert includes only a Z gradient coil (say in the insert shown in FIG. 2) the X and Y gradient coils 52x, 52y in the main MRI machine 1 may be used in cooperation with the Z gradient coil 2z in the insert 2.

In other situations, both gradient coils on one particular axis in the main MRI machine 1 and the insert 2 might be used together.

For example, the insert shown in FIG. 2 may be used in a situation where the X, Y and Z, gradient coils 52x, 52y, 52z from the MRI machine 1 are used in conjunction with the Z gradient coil 2z of the insert. This can provide different options for spatial encoding.

In the above situations the gradient coils 52 in the main MRI machine 1 will be driven at conventional frequencies whilst the gradient coils in the insert 2 are driven at ultrasonic frequencies.

Figure 6:
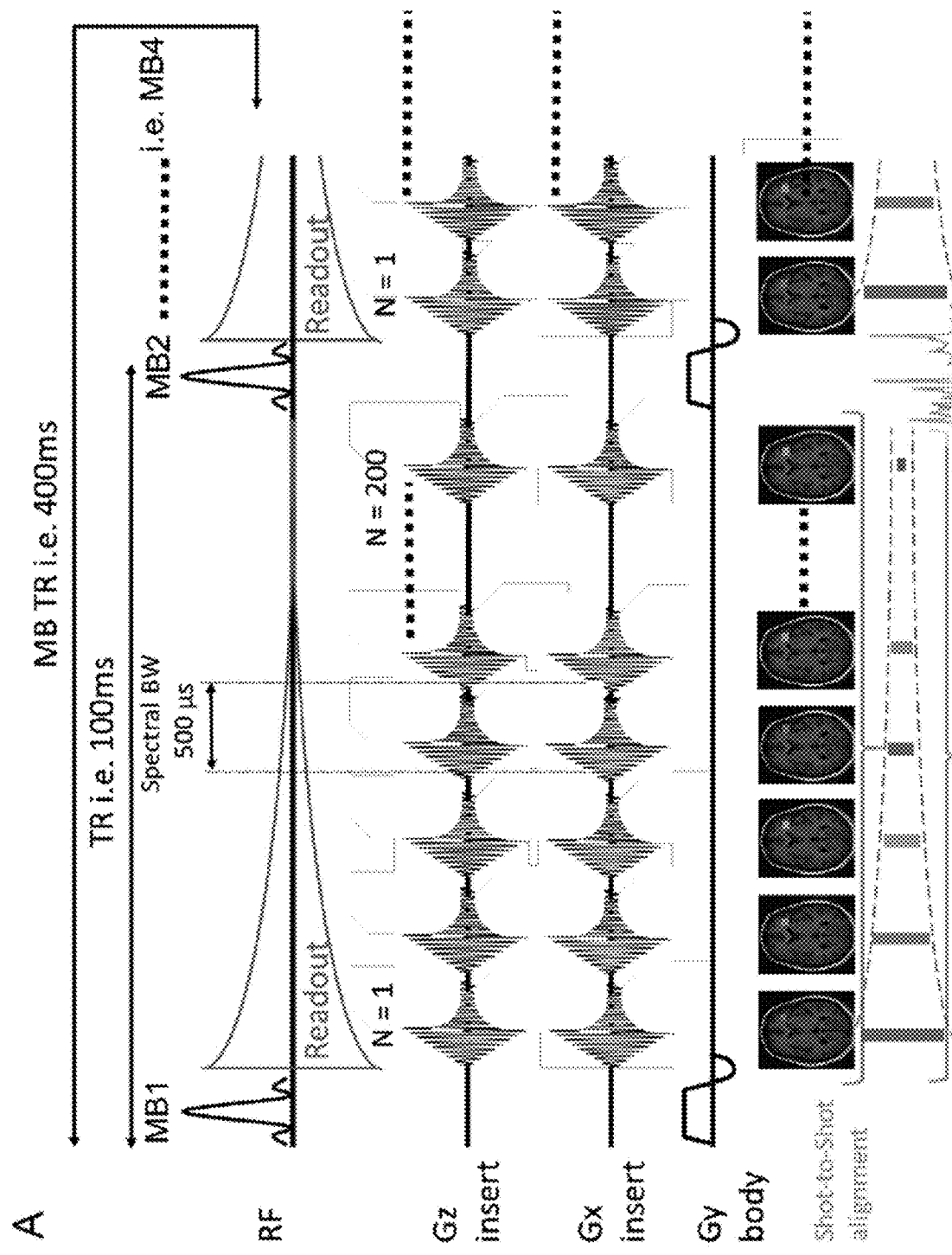
FIG. 6 shows a timing chart illustrating an echo planar spectroscopic imaging technique which may be carried out with an MRI system arrangement of the type shown in FIG. 1.

FIG. 6 shows a timing chart for an echo planar spectroscopic imaging (EPSI) technique which can be carried out using an MRI system arrangement of the type described above. In particular the MRI system arrangement of FIG. 1 when used in conjunction with the insert of the type described in relation to FIGS. 1 and 3 above, may be used as an echo planar spectroscopic imaging system and operated in accordance with the timing chart shown in FIG. 6.

In this technique, the Z gradient coil 2z of the insert 2 is used together with the X gradient coil of the insert 2x and the Y gradient coil 52y of the main MRI machine 1. The timing chart 6, shows the signals applied to these gradient coils schematically when carrying out the technique of FIG. 6. As will be appreciated "Gz insert" refers to the signals applied to the Z gradient coil 2z of the insert, "Gx insert" refers to the signals applied to the X gradient coil 2x and "Gy body" refers to the signals applied to the Y gradient coil 52y of the main MRI machine.

Further, in the timing chart RF it indicates the signals applied using the transmission coils 53 of the main MRI machine 1.

At the start of each repetition period (TR) a multiband pulse is applied by the RF transmission coils 53 and a slices selection pulse is applied to the Y gradient coil 52y of the MRI machine 1. Then in a following read-out period a respective plurality of chirp pulses is applied on the one hand to the Z gradient coil 2z of the insert 2 and on the other hand to the X gradient coil 2x of the insert 2. In the present embodiment each chirp has a length of 500 microseconds and a total of 200 such chirps are applied to each of the Z gradient coils and X gradient coils 2z, 2x, in the read-out period.

In the present embodiment each of the chirps is of the same waveform as each of the other of the chirps and the chirps on the Z gradient coil 2z and the X gradient coil 2x are applied in phase with each other. However, other possibilities are usable.

The goal in applying the chirps is to capture large K-space (amplitude per axis defines spatial resolution in that axis) and distance between K-space points/circles (decaying amplitude defines field of view).

With this technique all spatial encoding can be defined in each chirp while spectral information is encoded over the group of chirps, i.e. over the 200 chirps in this example. The number of chirps and their length and the aggregate length of the chirps will determine the spectral bandwidth and resolution. Thus, in the current example, where the length of each chirp is 500 microseconds, the bandwidth will be 2 kHz, and with the aggregate length of chirps of 100 milliseconds this will result in a resolution of in the order of 10 Hz (excluding relaxation and other small order effects).

In another embodiment each chirp may be one millisecond in length. In such a case, if 200 chirps are again applied, this will result in a bandwidth of 1 kHz and resolution of in the order of 5 Hz rather than 10 Hz in the example above.

Each chirp consists of a limited time varying amplitude application of the ultrasonic frequency at which the respective insert gradient coil 2z, 2x is arranged to run. In this example, the two ultrasonic frequencies are the same although in other cases they may be different, yielding the additional benefits mentioned above.

In the present embodiment four shots are used to increase the accuracy of the results as indicated in the timing chart. A second multiband pulse in MB2 is provided that the start of the second shot and again an appropriate slice selection signal is applied to the Y gradient coil 52y of the main MRI machine 1. Following this a second sequence of chirps is applied to the Z gradient coil and X gradient coil 2z, 2x of the insert 2 during the read-out period of this second shot. The whole process is repeated again in third and fourth shots so that acquired magnetic resonance data may be fed to the reconstruction section R for reconstruction of the image and spectral data associated with the image. The reconstruction system R may be arranged under software for carrying out SENSE (Sensitivity Encoding) reconstruction.

If it is desired then further runs as described above may be carried out in order to obtain more data with a view to improving signal to noise ratio.

Alternately or in addition, further runs may be carried out in respect of different "Y-slices" of the subject. That is to say a different set of offset frequencies for slice selection may be applied to the RF coil 54 of the MRI machine 1 in order to select a second batch of slices for investigation and so on.

It will be noted that with this technique spatial encoding is carried out in each chirp and complete spatial encoding and spectral encoding for a set of slices may be carried out in a total of in the order of 100 milliseconds, where only one shot is used, or in the order of 400 milliseconds, where four shots are used as in the example shown in FIG. 6.

This means that image data and spectral data collected over a very short period can be considered. This can help avoid information being lost or confusion in the results which would occur in more conventional techniques where much longer encoding times are required. In a more traditional echo planar spectroscopic imaging technique, the data is encoded one voxel at a time over an area of interest with spatial encoding carried out to start with to in effect select a particular voxel, then spectroscopic sampling taking place in respect of that voxel before moving on to the next voxel. This leads to a much longer investigation period of in the order of several seconds.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An MRI system coil insert for use within a bore of a main MRI system, the coil insert comprising at least one gradient coil for creating a spatially varying magnetic field along a respective axis and being arranged to be electrically driven at an ultrasonic frequency, wherein the insert comprises a first gradient coil and a second gradient coil, at least one first capacitor is electrically connected to the first gradient coil so as to make the first gradient coil resonant at a first predetermined ultrasonic frequency, and at least one second capacitor is electrically connected to the second gradient coil so as to make the second gradient coil resonant at a second predetermined ultrasonic frequency, and wherein the first predetermined ultrasonic frequency is different from the second predetermined ultrasonic frequency and the difference in frequency between the first predetermined ultrasonic frequency and the second predetermined ultrasonic frequency is an inaudible frequency.

2. The MRI system coil insert according to claim 1 having a central region free from gradient coil windings.

3. The MRI system coil insert according to claim 2 having a window in the insert through which a patient can see when the head of the patient is located within the insert.

4. The MRI system coil insert according to claim 1 which comprises a Z gradient coil for creating a spatially varying magnetic field along the main axis of the insert.

5. The MRI system coil insert according to claim 4 in which the Z gradient coil comprises a first set of windings provided at a first end of the insert and a second set of windings provided at a second end of the insert.

6. The MRI system coil insert according to claim 4 in which the Z gradient coil comprises more than two sets of windings, the windings being arranged to allow the provision of a segmented gradient on the Z-axis.

7. The MRI system coil insert to claim 1 which comprises an X gradient coil or a Y gradient coil for creating a spatially carrying magnetic field transverse to the main axis of the insert.

8. The MRI system coil insert to claim 1 which comprises a first gradient coil for creating a spatially varying magnetic field along a first respective axis and a second gradient coil for creating a spatially varying magnetic field along a second respective axis.

9. The MRI system coil insert according to claim 5 further comprising an X gradient coil or a Y gradient coil for creating a spatially varying magnetic field transverse to the main axis wherein the X or Y gradient coil comprises a third set of windings and a fourth set of windings which are provided on radially opposite sides of the insert and axially between the first and second sets of windings of the Z gradient coil.

10. The MRI system coil insert according to claim 9 in which a circumferential spacing is provided between the third and fourth set of windings such that there is a region in the insert free from windings of the Z gradient coil and windings of the X or Y gradient coil.

11. The MRI system coil insert according to claim 9 in which each of the third set of windings and the fourth set of windings comprises a plurality of helically wound turns where each complete turn has an inner arcuate segment, a first end segment extending outwardly to an outer arcuate segment, and a second end segment extending inwardly from the outer arcuate segment to a corresponding inner arcuate segment of a subsequent turn.

12. An MRI system arrangement comprising an MRI system having a main bore, and an MRI system coil insert according to claim 1 for use within said bore.

13. An MRI system coil insert arrangement comprising a coil insert for use within a bore of a main MRI system, the coil insert comprising at least one gradient coil for creating a spatially varying magnetic field along a respective axis and being arranged to be electrically driven at an ultrasonic frequency, and a signal generator arrangement for electrically driving the at least one gradient coil at ultrasonic frequencies, wherein the insert comprises a first gradient coil and a second gradient coil, and the signal generator arrangement is arranged to drive the first gradient coil at a first selected ultrasonic frequency and to drive the second gradient coil at a second selected ultrasonic frequency, the first selected ultrasonic frequency is different from the second selected ultrasonic frequency and the difference in frequency between the first selected ultrasonic frequency and the second selected ultrasonic frequency is an inaudible frequency.

14. The MRI system coil insert arrangement according to claim 13 in which at least one first capacitor is electrically connected to the first gradient coil so as to make the first gradient coil resonant at a first predetermined ultrasonic frequency, and at least one second capacitor is electrically connected to the second gradient coil so as to make the second gradient coil resonant at a second predetermined ultrasonic frequency, wherein the first selected frequency is the same as the first predetermined frequency and the second selected frequency is the same as the second predetermined frequency.

15. An MRI system coil insert arrangement according to claim 13 which further comprises a Z gradient coil for creating a spatially varying magnetic field along the main axis of the insert, wherein the Z gradient coil comprises a first set of windings provided at a first end of the insert and a second set of windings provided at a second end of the insert and the windings of the Z gradient coil and the signal generator arrangement are arranged to provide a segmented gradient on the Z-axis.

16. An MRI system arrangement comprising an MRI system having a main bore, and an MRI system coil insert arrangement according to claim 13 with the coil insert arranged for use within said bore.

17. An echo planar spectroscopic imaging system comprising an MRI system arrangement having an acquisition section for acquiring magnetic resonance data and a reconstruction section for reconstructing images and spectroscopic information from acquired magnetic resonance data,
the acquisition section comprising:
an RF transmission arrangement arranged to output single- or multi-band RF pulses;
a first gradient coil arranged to be driven at an ultrasonic frequency for creating a spatially varying magnetic field along a first respective axis and a second gradient coil arranged to be driven at an ultrasonic frequency for creating a spatially varying magnetic field along a second respective axis; and
a signal generator arrangement for electrically driving the first gradient coil at a first selected ultrasonic frequency and driving the second gradient coil at second selected ultrasonic frequency, wherein the signal generator arrangement is configured, as part of acquiring the magnetic resonance data, to apply, during a readout period, a plurality of chirp pulses to the first gradient coil and to apply a plurality of chirp pulses to the second gradient coil so as to achieve spectral encoding and spatial encoding on the first and second respective axes; and
the acquisition section is arranged to readout magnetic resonance data during said readout period and the reconstruction section is arranged to reconstruct an image and spectral information relating to the image from the magnetic resonance data readout during said readout period.

18. The echo planar spectroscopic imaging system according to claim 17 in which each chirp pulse has a length of less than 10 milliseconds.

19. The echo planar spectroscopic imaging system according to claim 17 in which the signal generator arrangement is configured to apply at least 10 chirp pulses during said readout period.

20. The echo planar spectroscopic imaging system according to claim 17 in which the acquisition section is to be arranged to acquire magnetic resonance data during a plurality of readout periods in order to produce a set of magnetic resonance data, and the acquisition section is arranged to cause the RF transmission arrangement to output a single- or multi-band RF pulse before the start of each readout period and the acquisition is arranged to apply, during each readout period, a respective plurality of chirp pulses to the first gradient coil and to apply a respective plurality of chirp pulses to the second gradient coil so as to achieve spectral encoding and spatial encoding on the first and second respective axes.

21. The echo planar spectroscopic imaging system according to claim 17 in which the first selected ultrasonic frequency is different from the second selected ultrasonic frequency.

22. The echo planar spectroscopic imaging system according to claim 21 in which the difference in frequency between the first selected ultrasonic frequency and the second selected ultrasonic frequency is an inaudible frequency.

23. The echo planar spectroscopic imaging system according to claim 17 in which the acquisition section comprises at least one first capacitor electrically connected to the first gradient coil so as to make the first gradient coil resonant at a first predetermined ultrasonic frequency, and at least one second capacitor electrically connected to the second gradient coil so as to make the second gradient coil resonant at a second predetermined ultrasonic frequency.

24. The echo planar spectroscopic imaging system according to claim 23 in which the first selected frequency is the same as the first predetermined frequency and the second selected frequency is the same as the second predetermined frequency.

25. The echo planar spectroscopic imaging system according to claim 17 in which the acquisition section further comprises a third gradient coil arranged to be electrically driven for creating a spatially varying magnetic field along a third respective axis and the signal generator arrangement is arranged for electrically driving the third gradient coil to provide spatial encoding on the third respective axis to allow selection of a slice in the subject under investigation from which the above mentioned magnetic resonance data, or set of magnetic resonance data is acquired during the respective readout period or respective plurality of readout periods.

26. The echo planar spectroscopic imaging system according to claim 17 in which the MRI system arrangement comprises an MRI system having a main bore and an MRI system coil insert arrangement for use within said bore, said insert comprising the first gradient coil and the second gradient coil.

27. The echo planar spectroscopic imaging system according to claim 17 in which the MRI system arrangement comprises an MRI system having a main bore and an MRI system coil insert for use within said bore, said coil insert comprising at least one gradient coil for creating a spatially varying magnetic field along a respective axis and being arranged to be electrically driven at an ultrasonic frequency.

28. A method of echo planar spectroscopic imaging using an MRI system arrangement having an acquisition section for acquiring magnetic resonance data and a reconstruction section for reconstructing images and spectroscopic information from acquired magnetic resonance data, the method comprising:

applying a single- or multi-band RF pulse to a subject under investigation;

electrically driving a first gradient coil arranged at a first ultrasonic frequency for creating a spatially varying magnetic field along a first respective axis and electrically driving a second gradient coil at a second ultrasonic frequency for creating a spatially varying magnetic field along a second respective axis;

as part of acquiring magnetic resonance data, applying, during a readout period a plurality of chirp pulses to the first gradient coil and a plurality of chirp pulses to the second gradient coil so as to achieve spectral encoding and spatial encoding on the first and second respective axes;

reading out magnetic resonance data during said readout period; and reconstructing an image and spectral information relating to the image from the magnetic resonance data readout during said readout period.

* * * * *